United States Patent
Villarino-Villa et al.

(10) Patent No.: US 8,208,594 B2
(45) Date of Patent: Jun. 26, 2012

(54) METHOD AND DEVICE FOR CLOCK-DATA RECOVERY

(75) Inventors: Rubén Villarino-Villa, Munich (DE); Markus Freidhof, Kirchseeon (DE); Thomas Kuhwald, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 341 days.

(21) Appl. No.: 12/595,127

(22) PCT Filed: Aug. 20, 2008

(86) PCT No.: PCT/EP2008/006852
§ 371 (c)(1), (2), (4) Date: Oct. 8, 2009

(87) PCT Pub. No.: WO2009/039924
PCT Pub. Date: Apr. 2, 2009

(65) Prior Publication Data
US 2010/0141308 A1    Jun. 10, 2010

(30) Foreign Application Priority Data

Sep. 21, 2007 (DE) .................. 10 2007 045 085
Feb. 29, 2008 (DE) .................. 10 2008 011 845

(51) Int. Cl.
*H04L 7/00* (2006.01)
(52) U.S. Cl. ........ 375/355; 375/371; 375/373; 375/375; 375/376; 375/350; 713/400; 713/500; 713/501; 713/502; 713/503; 327/147; 327/150; 327/156; 327/159

(58) Field of Classification Search .................. 375/355, 375/371, 374, 316, 373, 375, 376, 350; 327/147, 327/150, 156, 159; 713/400, 500–503
See application file for complete search history.

(56) References Cited

U.S. PATENT DOCUMENTS

| | | | |
|---|---|---|---|
| 4,771,250 A | 9/1988 | Statman et al. | |
| 5,469,466 A | 11/1995 | Chu | |
| 6,326,851 B1 | 12/2001 | Staszewski et al. | |
| 6,809,598 B1 | 10/2004 | Staszewski et al. | |
| 7,076,377 B2 * | 7/2006 | Kim et al. | 702/66 |

(Continued)

FOREIGN PATENT DOCUMENTS

DE      102006007022 A1     8/2007
(Continued)

OTHER PUBLICATIONS

International Preliminary Report on Patentability, PCT/EP2008/006852, dated Apr. 15, 2010, pp. 1-9.

(Continued)

*Primary Examiner* — Phuong Phu
(74) *Attorney, Agent, or Firm* — Ditthavong Mori & Steiner, P.C.

(57) ABSTRACT

A method for the recovery of a clock signal from a data signal is provided where the edges of the signals are each represented as a chronologically-ordered sequence of timing points. In one procedural stage, a plurality of timing points of the data signal are processed in parallel as follows: resolving the timing points of the data signal by a nominal clock pulse; estimating the bit-period deviations for the adjusted timing points; and injecting the nominal clock pulse to the estimated bit-period deviations.

9 Claims, 8 Drawing Sheets

U.S. PATENT DOCUMENTS

| | | |
|---|---|---|
| 2002/0094052 A1 | 7/2002 | Staszewski et al. |
| 2004/0096025 A1 | 5/2004 | Rupp |
| 2004/0136450 A1 | 7/2004 | Guenther |
| 2005/0144416 A1 | 6/2005 | Lin |
| 2007/0047686 A1* | 3/2007 | Aoki et al. .................. 375/374 |
| 2007/0085579 A1 | 4/2007 | Wallberg et al. |
| 2007/0205931 A1 | 9/2007 | Vanselow et al. |

FOREIGN PATENT DOCUMENTS

| | | |
|---|---|---|
| EP | 0312671 A1 | 4/1989 |
| EP | 0912010 A1 | 4/1999 |
| EP | 1152562 A1 | 11/2001 |
| GB | 2359223 A | 8/2001 |
| WO | WO 2007/059409 A2 | 5/2007 |

OTHER PUBLICATIONS

International Search Report, WO 2007/059409 A3, Aug. 3, 2007, pp. 1-5.

Parhi K K et al. "Pipeline Interleaving and Parallelism in Recursive Digital Filters—Part I: Pipelining Using Scattered Look-Ahead and Decomposition", IEEE Transactions on Acoustics, Speech, and Signal Processing, vol. 37, No. 7, Jul. 1989, New York, US.

Parhi K K et al. "Pipeline Interleaving and Parallelism in Recursive Digital Filters—Part II: Pipelined Incremental Block Filtering", IEEE Transactions on Acoustics, Speech, and Signal Processing, vol. 37, No. 7, Jul. 1989, New York, US.

International Search Report, WO 2009/039924 A1, Jan. 28, 2009, pp. 32-37.

* cited by examiner

METHOD AND DEVICE FOR CLOCK-DATA RECOVERY

CROSS-REFERENCE TO RELATED APPLICATIONS

The present application is a national phase application of PCT Application No. PCT/EP2008/006852, filed on Aug. 20, 2008, and claims priority to German Application No. 10 2007 045 085.2, filed on Sep. 21, 2007, and German Application No. 10 2008 011 845.1, filed on Feb. 29, 2008, the entire contents of which are herein incorporated by reference.

BACKGROUND OF THE INVENTION

1. Field of the Invention

The invention relates to a method for clock-data recovery and an associated device.

2. Discussion of the Background

In digital transmission technology, many binary data streams, especially serial data streams are transmitted at a fast bit rate without an accompanying clock-data signal. The goal of clock-data recovery (CDR) is to determine the frequency and phase of the underlying transmission clock data from the received data stream.

In a conventional receiver, the recovered clock signal is used for decoding the transmitted bit sequence by sampling the received signal pulses exactly in the center in order to maximize the signal-noise ratio. In signal analysis, the recovered clock signal is used to evaluate the signal quality, typically with reference to so-called eye diagrams and mathematical tools for jitter analysis.

The transmitted clock pulse is often determined by means of a PLL (Phase-Locked Loop), a phase-locked control loop. For the analysis of signal quality, various standards specify a standardized receiver in the form of PLL properties. In this context, the recovered clock signal determines the ideal bit starting point according to definition. The evaluation of deviations between the zero passes in the received data stream and in the clock signal forms the basis of the data analysis.

For signal analysis or jitter analysis, the transmitted clock pulse is recovered, in principle, in two different ways:

The PLL is realized with hardware components. The user feeds the time-continuous data stream into the PLL and receives in return a time-continuous clock signal and the data stream delayed by the processing latency. The data stream and clock signal are synchronized with one another. The method operates online in real time; the data stream is constantly observed.

The PLL is simulated in software with a rule for computation. A test device takes up one portion of the data stream and applies the clock-data recovery algorithm to it. The clock signal for the recorded data portion is recovered from this. This method generally operates offline, because the processing time of the algorithm is longer than the time duration of the recorded data portion.

Hardware PLLs known in the prior art can be subdivided into three categories: linear PLLs, digital PLLs and all-digital PLLs. The three types of PLL process and generate analog, time-continuous signals, wherein the digital and all-digital PLLs are adapted to the processing of binary serial data streams.

The rule for computation, which simulates the method of functioning of a hardware PLL, is generally referred to as a software PLL. One approach is to describe the method of operation of the analog components mathematically and to process a highly-sampled version of the received data stream with this. A second approach is based on the observation that only the zero passes in the data stream contain the relevant information for the clock-data recovery. In this case, the position of the zero passes is initially determined by interpolation of the stored data portion, and the zero passes of the clock signal are then calculated from this.

FIG. 1 shows the simplified structure of a software PLL according to the latter approach of the prior art. The input signal $x_0(k)$ is a list with the position in time of the zero passes in the data stream, also referred to below as data edges. The calculated clock edges are described by $y(k)$. The PLL generates only one clock edge per bit period. If the underlying, time-continuous clock signal is imagined as a sinusoidal oscillation, then $y(k)$ designates the timing points with phase equal to 0.

The $x_0(k)$ are sorted chronologically and processed sequentially. Initially, the time difference $e(k)$ between data edges and clock edges is formed in the phase detector. Since no signal throughput takes place when the transmitter transmits two or more identical bits in succession, the number of data-edges is generally smaller than the number of bits transmitted. If the time-difference value is greater than one half bit period $T_0$, a missing edge can be assumed, and, by way of example, $e(k)=0$ is set; otherwise, the phase detector passes on the time difference $e(k)$ without change. The term $e(k)$ is filtered with the loop filter $F(q^{-1}) \cdot F(q^{-1})$ describes a differential equation as a function of the delay operator $q^{-1}$, for which the following applies by way of example: $2 \cdot q^{-1} \cdot e(k) = 2 \cdot e(k-1)$. The resulting $d(k)$ together with a constant $T_0$, which indicates the nominal bit period of the data stream, provides an estimate of the momentary bit period of the data stream. The accumulator $A(q^{-1})$ determines the position of the next clock edge, by adding the momentary bit-period estimate to the last clock edge. The underlying method of functioning can be described algorithmically as follows:

Phase or timing error: $e(k) = x_0(k) - y(k)$

Filtered error: $d(k) = F(q^{-1}) \cdot e(k)$

Momentary bit-period estimate: $T_b(k) = T_0 + d(k)$

Next clock edge: $y(k+1) = q \cdot A(q^{-1}) \cdot T_b(k)$

Through the targeted selection of coefficients of $F(q^{-1})$ and $A(q^{-1})$, the above software PLL can approximate the theoretical PLL transmission function very well, provided it operates offline. In the case of a realization operating in real time, it should be remembered that each of the above processing stages requires a certain processing time. The overall realization-specific delay falsifies the transmission function of the phase-locked loop and can even endanger stability. As a rule of thumb, a realtime-capable software PLL according to the prior art can be used only for the analysis of data streams, of which the bit period is longer than the processing time for the calculation of a new clock edge.

SUMMARY OF THE INVENTION

Embodiments of the present invention advantageously provide a method and a device for clock-data recovery, which determines the clock-edge positions through the parallel processing of several data edges. The parallel processing allows a relatively-higher throughput than with conventional software PLLs. The method and the device approximate the theoretical PLL transmission function, wherein the stability of the phase-locked loop is always guaranteed.

The stages of the method for clock-data recovery according to the invention are as follows:

Predictive assignment of the clock edges and data edges. The missing edges resulting from the transmission of several identical bits in succession are identified and dealt with separately.

Extraction of a clock signal (Nominal Clock) based on the nominal bit period $T_0$. This corresponds to the extraction of a linear trend from the data edges.

Filtering of the trend-adjusted data edges for the recovery of the corresponding trend-adjusted clock edges.

Injection of the Nominal Clock in order to determine the final clock-edge positions.

In other words, the phase-locked loop from FIG. 1 is transformed in such a manner that the PLL core consists only of the loop filter $F(q^{-1})$, the accumulator $A(q^{-1})$ and the adder for determination of the phase error e(k). An auxiliary structure outside the phase-locked loop identifies the missing edges and assigns clock edges and data edges accordingly. The contribution of the nominal bit periods $T_0$ is replaced by additional auxiliary structures, which in each case extract and then inject a linear trend before and after the main phase-locked loop, also referred to below as the PLL core. The remaining PLL core is given by a conventional linear differential equation.

If required, all functional blocks and processing stages can process a plurality of edges in parallel. Advantageous embodiments are outlined in the section below.

DETAILED DESCRIPTION OF THE INVENTION

The invention has its origin in the transformation of the classic block-circuit diagram of a software PLL.

Figure 1:
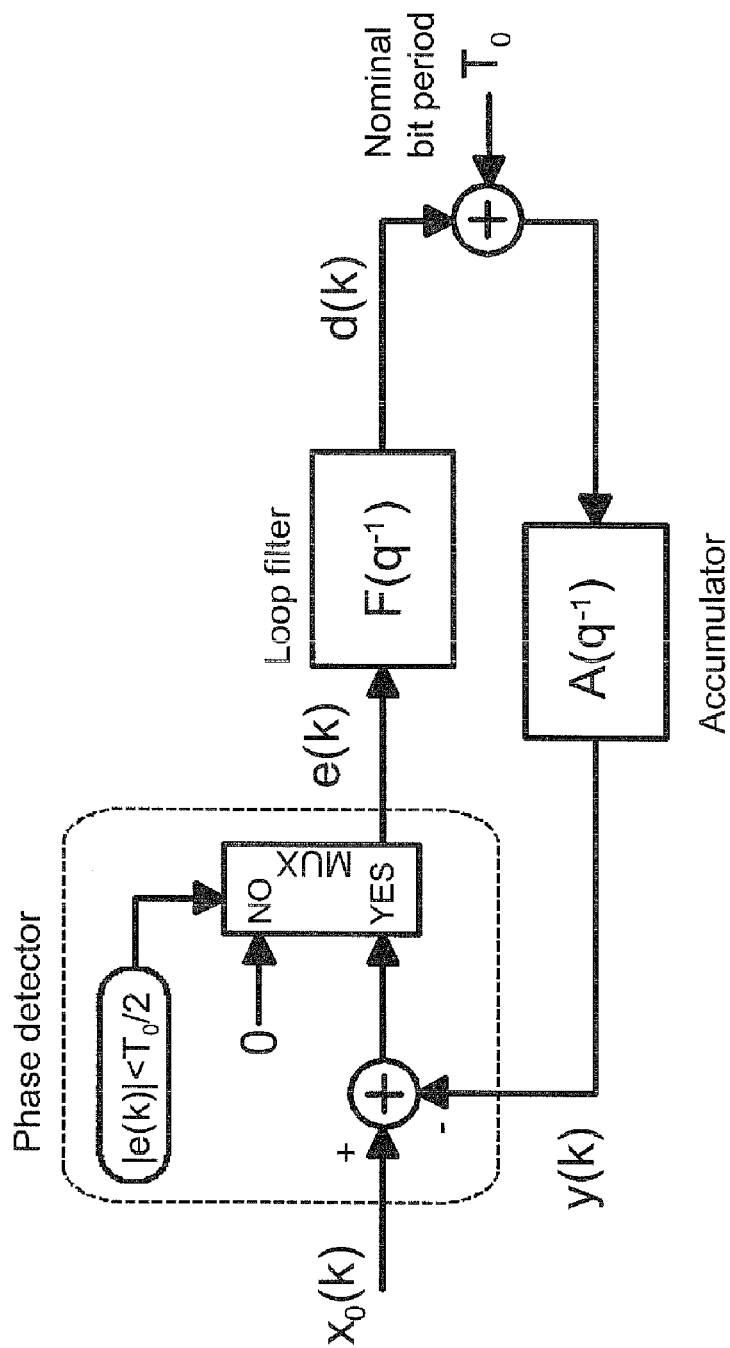
FIG. 1 shows a block-circuit diagram of a formerly-conventional data-edge-processing software PLL.
Figure 2:
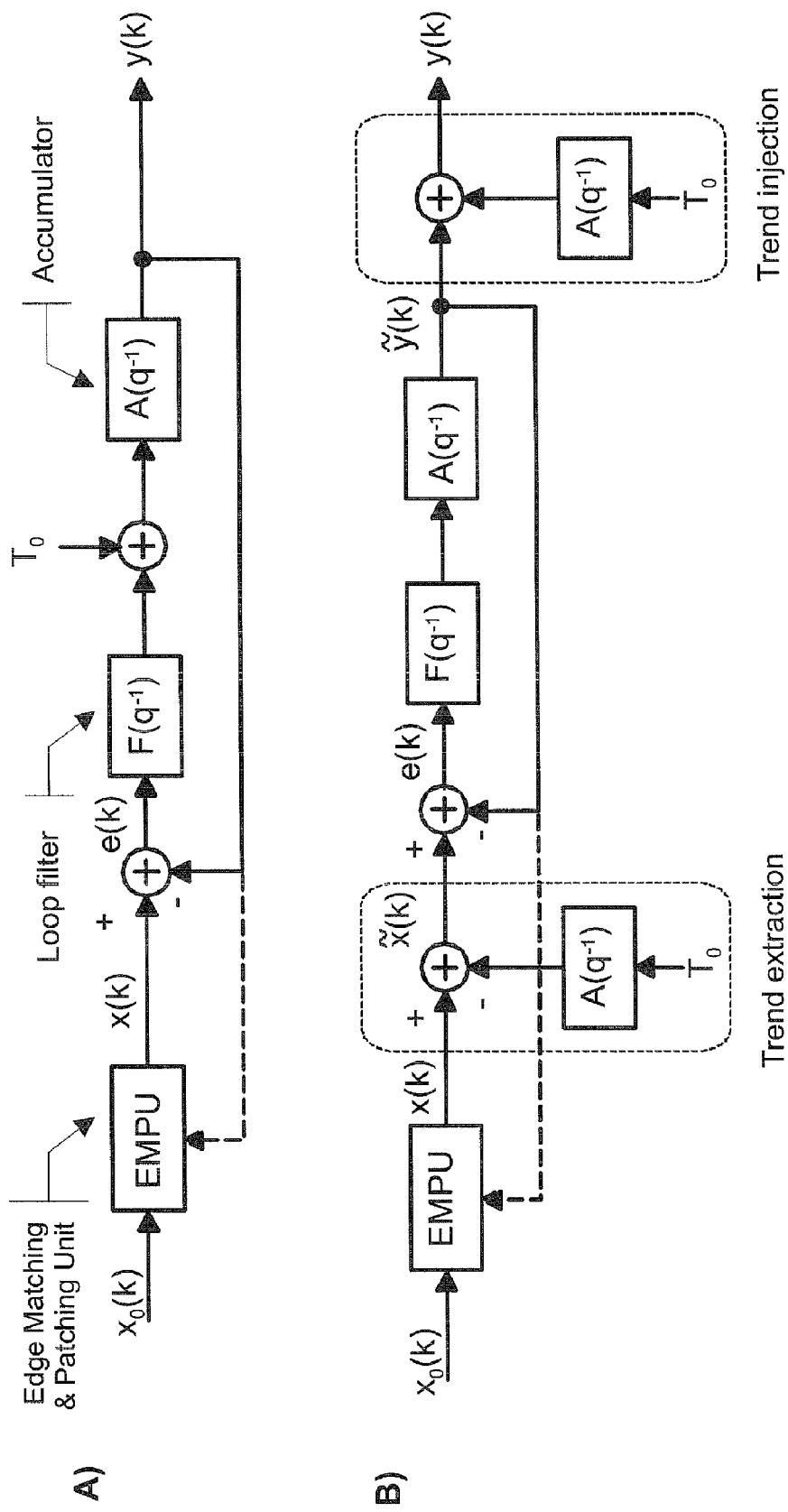
FIG. 2 shows block-circuit diagrams of a software PLL according to two embodiments of the invention.

In block-circuit diagram A, FIG. 2 shows a first transformation of the block-circuit diagram from FIG. 1. The assignment of the clock edges and data edges implemented in the phase detector is displaced outside the phase-locked loop into the EMPU block (Edge Matching and Patching Unit). From the coarse data-edge sequence $x_0(k)$, which generally provides several missing edges, the EMPU supplies an interpolated, gap-free data-edge sequence x(k). The dotted line indicates that the EMPU is coupled with the main phase-locked loop, for example, via the recovered clock edges y(k).

Block-circuit diagram B from FIG. 2 presents the second transformation of the structure of a software PLL according to the invention based on block-circuit diagram A. The contribution of the nominal bit period $T_0$, which allows the PLL to run with the nominal bit period when the loop-filter output is suppressed, and corresponds, in a time-continuous PLL, to the nominal frequency of the VCO (Voltage Controlled Oscillator), has been removed from the loop in block-circuit diagram B in FIG. 2 and replaced by a pre-processing and post-processing stage.

The loop filter $F(q^{-1})$ and the accumulator $A(q^{-1})$ define conventional linear differential equations as a function of the delay operator $q^{-1}$.

For example:

$$a(k) = G(q^{-1})b(k) \text{ with } G(q^{-1}) = \frac{1 + g_2 \cdot q^{-1}}{1 - g_1 \cdot q^{-1}}$$

describes the differential equation:

$$a(k) - g_1 \cdot a(k-1) = b(k) + g_2 \cdot b(k-1)$$

According to block-circuit diagram A in FIG. 2, the following applies:

$$y(k) = A(q^{-1}) \cdot (F(q^{-1}) \cdot (x(k) - y(k)) + T_0). \tag{1}$$

Let the following be defined:

$$\tilde{x}(k) = x(k) - A(q^{-1}) \cdot T_0, \; \tilde{y}(k) = y(k) - A(q^{-1}) \cdot T_0. \tag{2}$$

In this context, it should be noted that the term $t(k) = A(q^{-1}) \cdot T_0$ describes the accumulation or integration of a constant signal with growing edge index k and functionally defines a straight line of gradient $T_0$.

The following is obtained from equations (1) and (2):

$$\begin{aligned} y(k) &= A(q^{-1}) \cdot (F(q^{-1}) \cdot (x(k) - y(k))) + A(q^{-1}) \cdot T_0 \\ &= A(q^{-1}) \cdot (F(q^{-1}) \cdot (x(k) - y(k) + A(q^{-1}) \cdot T_0 - \\ & \quad A(q^{-1}) \cdot T_0)) + A(q^{-1}) \cdot T_0. \end{aligned} \tag{3}$$

Finally, the following is obtained:)

$$\tilde{y}(k) = A(q^{-1}) \cdot F(q^{-1}) \cdot (\tilde{x}(k) - \tilde{y}(k)) \tag{4}$$

Equation (4) corresponds to the phase-locked loop in block-circuit diagram B in FIG. 2, wherein equation (2) describes the pre-processing stage ("trend extraction") and the post-processing stage ("trend injection").

The consequence of the structure in block-circuit diagram B is that the transmission function of the phase-locked loop can be expressed as a linear, rational filter or respectively linear differential equation:

$$H(q^{-1}) = \frac{F(q^{-1}) \cdot A(q^{-1})}{1 + F(q^{-1}) \cdot A(q^{-1})} = \frac{\sum_{n=0}^{N} b_n \cdot q^{-n}}{\sum_{m=0}^{M} a_m \cdot q^{-m}} \tag{5}$$

As a result of the transformation into a differential equation, the original structure of the software PLL from FIG. 1 is largely lost, for example, the values e(k) and d(k) are no longer explicitly calculated. The advantage is that equation (5) can be realized in pipeline form with methods known from the literature, such as "Clustered Look-Ahead" or "Scattered Look-Ahead". Parallel implementations of recursive filters are described in particular in the two articles by K. Parhi and D. Messerschmitt ("Pipeline Interleaving and Parallelism in Recursive Digital Filters—Part I: Pipelining Using Scattered Look-Ahead and Decomposition" and "Pipeline Interleaving and Parallelism in Recursive Digital Filters—Part II: Pipelined Incremental Block Filtering", IEEE Transactions on Acoustics, Speech and Signal Processing, Vol. 37, No. 7, July 1989, pages 1099 to 1117 and respectively pages 1118 to 1134), the content of which is incorporated in full by way of reference in the present description. At this position, the slowest basic processing step restricts the maximum analysable data-stream bit rate, typically the system clock and not the total processing time of the phase-locked loop as in conventional software PLL.

One additional cost results from the pre-processing and post-processing stages. The term $t(k)=A(q^{-1}) \cdot T_0$ from equation (2) describes a straight line of constant gradient $T_0$ via the index k. The pre-processing block extracts this linear trend from the incoming data edges x(k) and the post-processing block adds it back again to the PLL output.

The data-edge positions of the analyzed data stream always represent a straight line of gradient $T_b$ via the index k. After the extraction of the linear trend, a residual trend of gradient $(T_b-T_0)$ remains. Consequently, the terms $|\tilde{x}(k)|$ and $|\tilde{y}(k)|$ grow over time in an unrestricted manner, if the data-stream bit period $T_b$ deviates from the nominal value $T_0$. To ensure that $|\tilde{x}(k)|$ and $|\tilde{y}(k)|$ remain limited, both values must be reset occasionally by a given offset. This can be implemented by a simultaneous increase in the auxiliary blocks and a resetting of the status of the main phase-locked loop, also referred to below as the PLL core, by the same offset value. Accordingly, the difference $e(k)=\tilde{x}(k)-\tilde{y}(k)$ is preserved.

In particular, the implementation of all functional blocks can take place in parallel in order to increase the rate of operation. This is understood to mean that several successive elements of the data-edge sequence $x_0(k)$ are processed in the same operational stage. The resulting clock-edge sequence y(k) is theoretically identical to the sequential processing of $x_0(k)$ with a conventional software PLL according to the prior art.

The parallel structure of the trend-extraction block and of the trend-injection block is uncomplicated, because the nominal clock continues to run with the nominal bit period $T_0$ known in advance. For the parallel realization of the linear filter or respectively of the linear differential equation from equation (5), methods are known, for example, from the literature for recursive block filtering (pipelined block filtering) can be used. The parallel edge assignment in the EMPU uses a prediction of the clock edges y(k) as a basis. The method of functioning and favorable embodiments of the EMPU are explained below.

Method of Functioning of the EMPU

Figure 3:
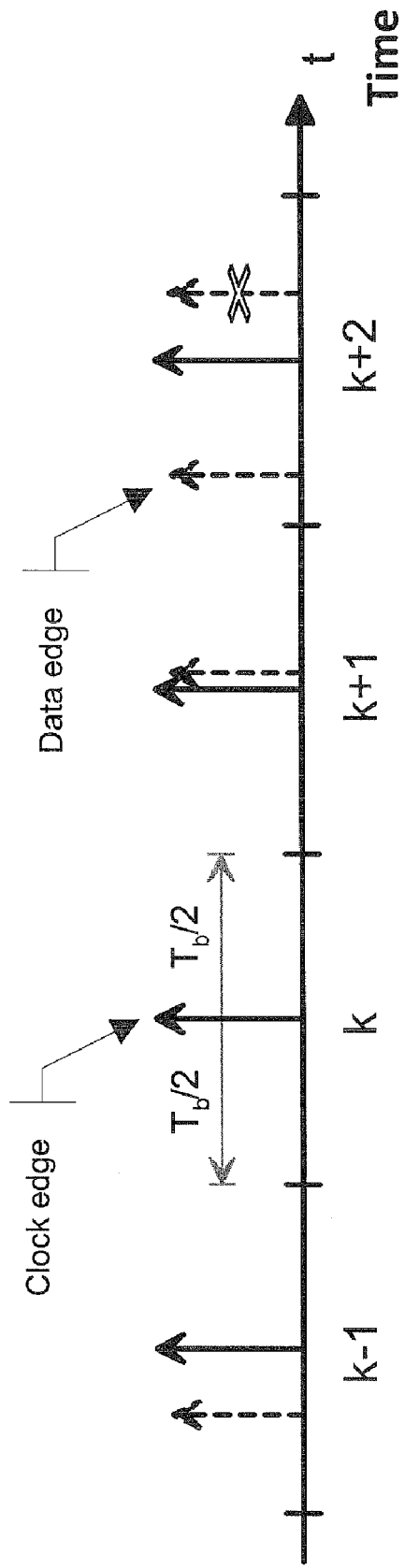
FIG. 3 shows the pairing of data and clock edges (edge assignment)

FIG. 3 shows an example of the basic edge-assignment problem. The data edges $x_0(k)$ and clock edges y(k) are each entered on the time axis with dotted and continuous arrows. The recovered clock edges represent the anticipated position of the interference-free data edges according to definition and are taken as a reference point for the edge assignment. Starting from the clock edges, the time axis is subdivided into mutually-adjacent intervals. By way of simplification, it should be imagined that every clock edge is disposed in the center of an interval of the length of one bit period $T_b$.

In theory, it is possible to distinguish between three cases:
1. If a single data edge is disposed within a given interval, it can be unambiguously assigned to the corresponding clock edge (indices "k−1" and "k+1" in FIG. 3).
2. If no data edge is disposed in an interval, a so-called "missing edge" may be present (index "k"). Missing edges occur with the transmission of the sequences "…00…" or "…11…", because no signal transition takes place between the two bits. Missing edges can be marked and dealt with separately.
3. Several data edges within the same interval can indicate glitches in the signal, low SNR or a not-yet-settled PLL. In this case, one data edge can be retained, and the rest can be rejected (index "k+2"). Alternatively, all edges can be rejected, because essentially, all are equally false.

Conventional software PLLs or hardware PLLs basically operate in a sequential manner and determine the clock edge y(k+1) by processing earlier data and clock edges up to the timing index k. For parallel edge assignment of the data-edge packet [x(k+1), x(k+2), ..., x(k+N)], a prediction of several clock edges is necessary, that is to say, the terms [y(k+1), y(k+2), ..., y(k+N)] must be estimated from the information up to the timing index k.

For this purpose, the EMPU defines a secondary clock signal, referred to below as the "Front Clock". The Front Clock represents a prediction of the recovered clock edges y(k) and is used to subdivide the time axis for the edge assignment. The Front Clock is coupled to the PLL core and consequently to the recovered clock edge y(k), as indicated by the dotted line in the block-circuit diagrams of FIG. 2.

In one possible embodiment, the Front Clock starts running immediately after the system initialisation with the nominal bit period $\hat{T}_b=T_0$. Only after L timing units or system-clock pulses processing latency does the PLL begin to process the data edges and to synchronize the clock edges to the received data stream by adaptation of $\hat{T}_b$. From this moment, the Front Clock and the recovered clock, also referred to below as the PLL clock, can operate with one another in a coupled manner, because, for example, the Front Clock can use $\hat{T}_b$ in order to follow the excursion of the PLL clock.

With this procedure, the Front Clock estimates the future values of the PLL clock according to the principle "the PLL clock will continue to run with the nominal bit period for the next L system clock pulses". In the event of a non-observance of this assumption, a phase offset occurs between the two clocks. The phase offset after the settling of the PLL to a data stream with constant bit period $T_b$ can be approximated as follows:

$$\varphi = \frac{T_b - T_0}{T_0} \cdot L \cdot (T_0 \cdot f_s)^{-1} [UI] \text{(Unit Interval)} \qquad (6)$$

wherein
$T_b$ the bit-period of the data stream;
$T_0$ the nominal bit period;
L the latency time, measured in system clock pulses between edge identification and output of the linear filter or respectively PLL core;
$f_s$ the system clock pulse of the underlying digital system (for example, digital signal processor); and
$(T_0 \cdot f_s)^{-1}$ the mean number of bits within one system clock pulse.

Figure 4:
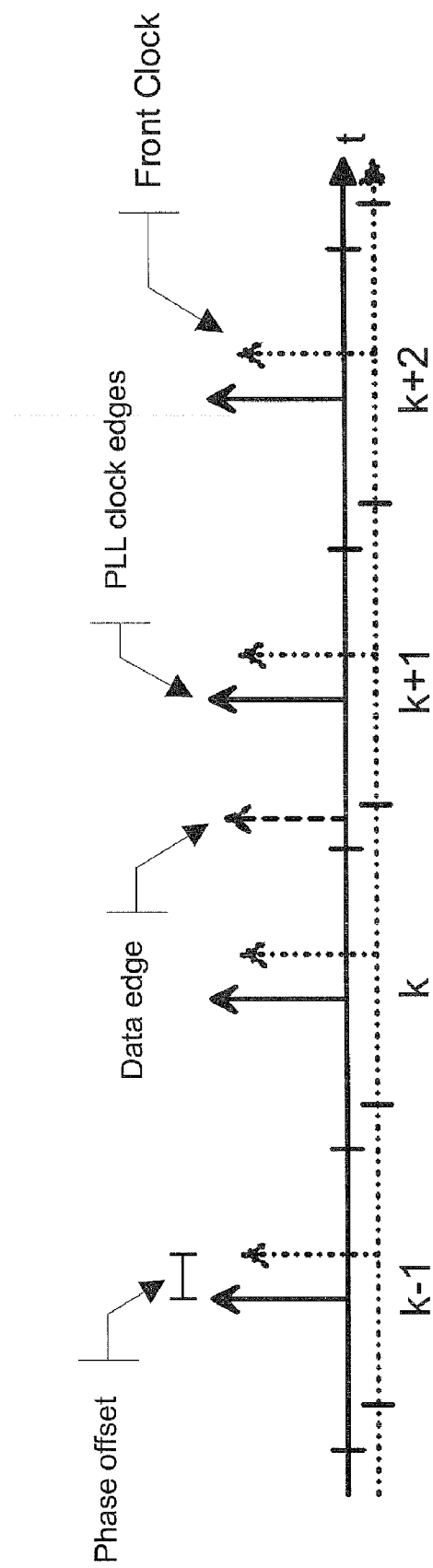
FIG. 4 shows the phase offset in the edge assignment.

The phase offset brings about a displacement of the time intervals in a case, in which the PLL clock has been used instead of the Front Clock for the edge assignment. In the case illustrated in FIG. 4, the data edge is disposed so unfavorably that the EMPU erroneously assigns it to the $k^{-th}$ interval because of the phase offset. An excessively-large phase offset can noticeably impair the settling properties and jitter robustness of the clock-data recovery.

An improved performance is generally obtained, if the Front Clock is determined according to the principle "the PLL clock will continue to run for the next L system clock pulses with the last estimated momentary bit period". Other prediction principles are conceivable.

In the case of a system operating online, the data stream is constantly observed. A volume of new data edges is provided regularly to the clock-data recovery, for example, every system clock pulse, via an external auxiliary device. One system clock pulse defines a given window on the time axis. Against this background, the method of functioning of the EMPU can be subdivided into two sub-tasks. Initially, with the assistance of the Front Clock, the clock edges covered by the current system clock pulse or respectively current time window are determined. Following this, the received data edges are paired with the clock edges.

Figure 5:
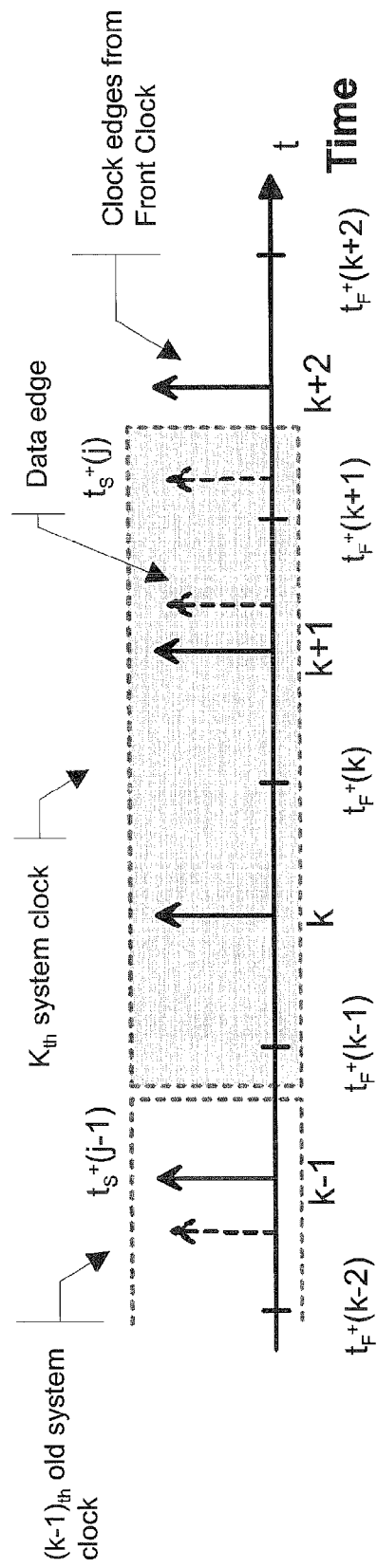
FIG. 5 shows the determination of the effective clock-edge number.

The example in FIG. 5 is presented by way of explanation. The data and clock edges are disposed on the time axis respectively as dotted and continuous arrows. The time window defined by the current system clock pulse is marked with a grey background. The following points are evident:

the $k^{-th}$ and $(k+1)^{-th}$ interval fit completely within the time window. The unambiguous assignment of clock and data edges is possible.

the portion of the $(k-1)^{-th}$ interval, which has not yet been observed in the $(j-1)^{-th}$ system clock pulse, is covered by the current time window. An unambiguous edge assignment is also possible after the $(k-1)^{-th}$ interval has been completely illuminated.

the $(k+2)^{-th}$ interval is only partially covered and cannot be released for edge assignment. The data edge already disposed within the interval is stored and evaluated in the next system clock pulse.

The Front Clock specifies the position of the clock edges $t_F(k)$. For the determination of the time intervals covered by the current time window, it is helpful to compare the upper limit of the $k^{-th}$ interval $t_F^+(k)$, which is derived from the clock edges, for example, according to $t_F^+(k)=t_F(k)+T_0/2$, with the upper limit of the $k^{-th}$ system clock pulse $t_S^+(j)$. With reference to FIG. 5, the following applies:

$t_F^+(k-1)$ has already been calculated in the evaluation of the $(k-1)^{-th}$ Sample Packet and is known.

$t_F^+(k-1)$, $t_F^+(k)$ and $t_F^+(k+1)$ are all smaller than $t_S^+(j)$. The corresponding intervals are released for edge assignment. The number of clock edges processed is three.

$t_F^+(k+2)$ is greater than $t_S^+(j)$. Both $t_F^+(k+2)$ and also the received data edge are stored until the next system clock pulse.

In summary, the effective number of clock edges in the $j^{-th}$ system clock pulse is determined with regard to how many $t_F^+(k)$ fit between the timing points $t_S^+(j-1)$ and $t_S^+(j)$.

Figure 6:
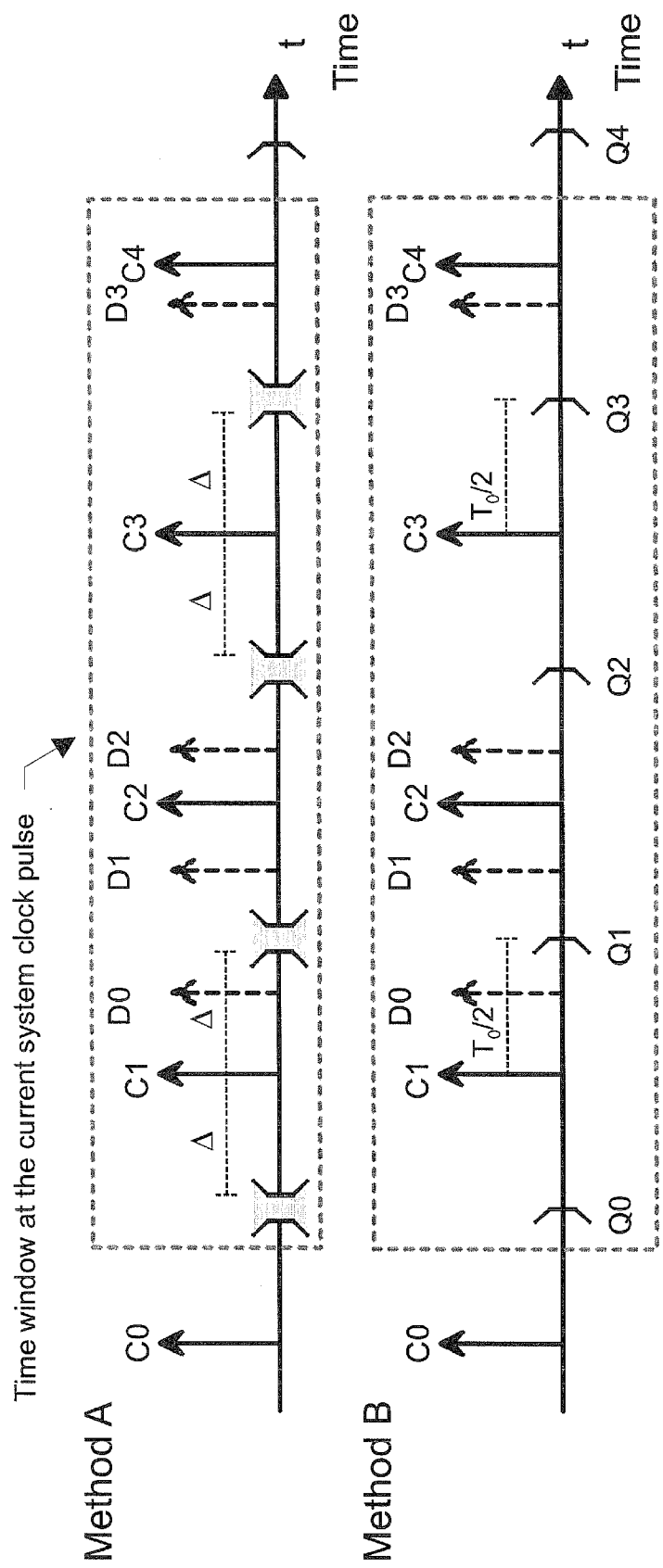
FIG. 6 shows two methods for edge assignment.

After determining the relevant time intervals of the current time window, the assignment of the data and clock edges is implemented. FIG. 6 presents two possible methods. Four data edges: D0 to D3 are contained in the time window. The effective number of clock edges is also four: C0, C1, C2 and C3. C4 is not processed, because its upper time limit $t_F^+(4)$ is disposed outside the time window.

Method A connects data edges to clock edges according to the rule:

If $|D_a-C_b|\leq \Delta$, then $D_a$ and $C_b$ fit together. $(a,b\geq 0)$, (7)

wherein $\Delta$ is selected in such a manner that the time axis is subdivided into non-mutually-overlapping intervals. Data edges, which are disposed in the regions not covered by the intervals, are simply ignored. According to FIG. 6, the following applies:

C0 and C3 remain without partners and are marked as missing edges. The missing edges are filled before filtering in the PLL core with an estimate of the PLL clock, such as a corrected version of the Front Clock.

C1 is linked to D0.

D1 and D2 compete for the clock edge C2. A maximum of one data edge per clock edge is permitted; accordingly, for example, the edge with the lowest index is preferred—in this case D1. The occurrence of a data-edge collision is reported as required.

In formal terms, the edge assignment can be described in matrix form by the following table:

TABLE 1

Assignment matrix for Method A.

| $\|D_a - C_b\| \leq \Delta$ | C0 | C1 | C2 | C3 |
|---|---|---|---|---|
| D0 |  | 1 | 0 | 0 |
| D1 | 0 | 0 | 1 | 0 |
| D2 | 0 | 0 | 1 | 0 |
| D3 | 0 | 0 | 0 | 0 |

The clock edges and data edges are each sorted chronologically. On the assumption that a maximum of one data edge occurs per bit period, the calculation of the elements in the lower, shaded triangular matrix can be skipped in order to reduce the computational cost. However, this reduces the robustness of the assignment matrix in the event that several data edges per bit period occur, as can be the case, for example, during the settling of the PLL. Compromise solutions, where only the elements of the lowest diagonal are automatically set to zero (0), are conceivable.

Method B presents a slight variation of the same principle. In this case, the time axis is subdivided over the timing points $Q_b$ in mutually-adjacent intervals. The $Q_b$ corresponds to the timing points $t_F^+(k)$, which are calculated in order to determine the effective number of clock-edges. The data and clock edges are now linked to one another according to the rule:

If $Q_{b-1}<D_a\leq Q_b$, then $D_a$ and $C_b$ fit together $(a,b\geq 0)$, (8)

This leads to an assignment matrix as in Method A—in the example considered, both matrices correspond exactly.

The identified missing edges are dealt with separately. The phase and timing error $e(k)$ between data and clock edges represents the control difference of the PLL phase-locked loop. In the case of missing edges, the phase error is not defined. In a conventional software PLL according to FIG. 1, the phase error $e(k)=0$ is introduced artificially for every missing edge. This corresponds to the case, that the gapped edge series $x_0(k)$ has been completed with artificial edges, which correspond exactly with the recovered clock edges $y(k)$.

The EMPU interpolates $x_0(k)$ and generates a gap-free data-edge sequence $x(k)$, which is then processed by the PLL core. The interpolation is implemented, for example, by filling missing edges with an artificial edge. In order to approximate the case $e(k)=0$, a prediction of the PLL clock edges, such as the Front Clock, is used. Other approaches, such as $e(k)=e(k-1)$ can be realized through an appropriate choice of the interpolating edges. Although the filling takes place in the EMPU for explanatory purposes, this can be realized dependent upon the implementation at one or more positions in the processing path between the missing-edge assignment and the PLL core.

Time Presentation

In practice, all timing points, including the data edges and clock edges are expressed with a finite bit-word width. The use of an absolute time reference is inappropriate for systems, which are in operation for long periods of time. In this context, the processing of relative time data is advantageous. This can be implemented, inter alia, in two mutually-combinable ways:

Periodic and synchronized resetting of the time reference of the data edges and the clock edges. This allows the data edges and clock edges to be expressed, for example, as an offset at the beginning of the current system clock pulse.

Compression of the time through the use of a normalization factor. This is particularly suitable for the processing of data streams with a bit period greater than one system clock pulse.

Complete System Overview

Figure 7:
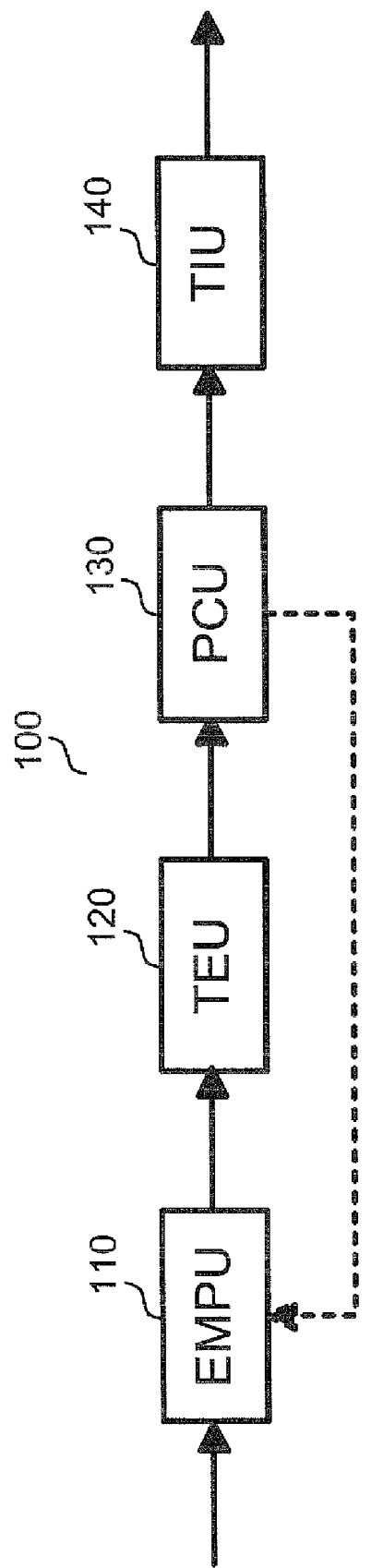
FIG. 7 shows a block-circuit diagram of an overall system for clock-data recovery according to an embodiment of the invention.

FIG. 7 provides an overview of the complete system for clock-data recovery according to the invention.

It is assumed that the data edges are provided in an appropriate format. For example, the time axis with low bit rates (that is to say, long bit periods) is additionally scaled, so that the edge timing points can be presented with a limited word width.

The system initially comprises an Edge Matching and Patching Unit (EMPU) 110, where the assignment between data edges and clock edges is implemented. An internal clock signal referred to as the Front Clock, indicates the approximate position of the clock edges. On this basis, the missing edges are identified and marked as such. The missing edges are interpolated in an appropriate manner, by way of example, here, but always before the block PCU 130, in order to obtain a gap-free data edge sequence. The data edges are sorted and routed without modification.

Moreover, the system comprises a Trend Extraction Unit (TEU) 120. A linear trend is extracted from the data edges. The linear trend is provided by the so-called Nominal Clock, which is driven exclusively with the nominal bit period. The output of the TEU consists of the data-edge positions relative to the Nominal Clock.

Furthermore, the system contains a PLL Core Unit (PCU) 130. The PCU contains the PLL core, which processes a plurality of data edges in parallel. The PLL core can be presented according to the invention as a linear filter or respectively a linear differential equation.

On the basis of the latency of the processing chain, two clock signals are used, on the one hand, the Front Clock in the EMPU for the assignment of data edges and clock edges, and on the other hand, the PLL clock supplied by the PCU, which is responsible for the calculation of the phase errors in the sense of e(k) in FIG. 1. The PCU estimates from the PLL clock the bit-period deviation relative to the nominal bit period. With information from the PCU, the EMPU determines the Front Clock, which basically represents a prediction of the PCU clock edges in order to bridge the processing latency.

Finally, the system comprises a Trend Injection Unit (TIU) 140. Here, the Nominal Clock is added to the clock edges from the PCU, in order to obtain the final clock-edge position. As in the TEU 120, the Nominal Clock describes a linear trend.

The PCU 140 is capable of processing in parallel a plurality of data edges through an appropriate implementation of the linear differential equation from Equation (5). In the online operating mode, in which the data signal is observed constantly, the number of data edges per time unit can fluctuate slightly. For example with a data stream with an average bit-period number of 2.5 per clock pulse, it can occur that 3 and 2 edges are processed alternately in parallel. The layout of the PCU is simplified if the PLL core is driven with a constant parallelism.

Figure 8:
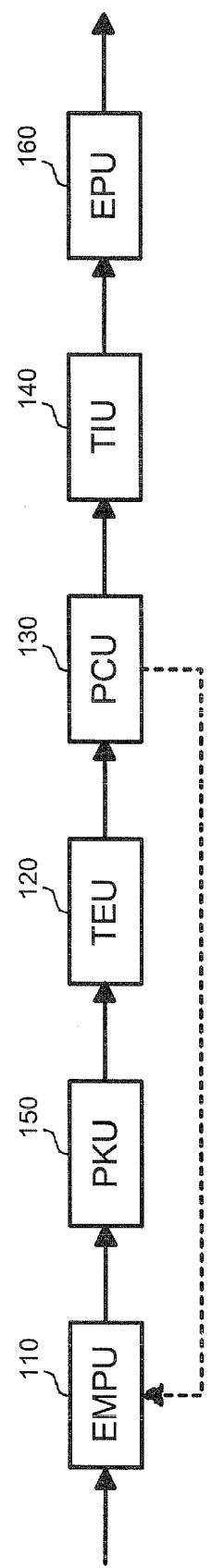
FIG. 8 shows a further block-circuit diagram of an overall system for clock-data recovery according to a second embodiment of the invention.

In this context, FIG. 8 illustrates a further embodiment of the invention. Always before the PCU and, for example, directly after the EMPU, the packetizer unit (PKU) 150 collects the incoming data edges and outputs them in packets of a fixed size. Throughput fluctuations occur as a result of the packetizing, because the PKU must occasionally introduce a waiting cycle in order to collect a sufficient number of data edges and, in this case, routes an empty data-edge packet to the next functional block. These throughput fluctuations are compensated in the Edge Publishing Unit (EPU) 160. The clock-edge packets are resolved and the clock edges are synchronized with the system time.

In another embodiment of the PCU, the parallel realization of the differential equation (5) can be bypassed, by initially decimating the data edges after appropriate lowpass filtering; the resulting data-edge stream is then processed with a PLL core of low or even single parallelism, and finally, the recovered, estimated clock edges are fed back via an interpolation stage to the original parallelism. For example, the decimation can be implemented by averaging over the elements in one data-edge packet. The clock edges can be recovered, for example, through linear interpolation of the decimated clock-edge sequence.

The invention is not restricted to the exemplary embodiment presented. All the features described and/or illustrated can be combined with one another within the framework of the invention.

The invention claimed is:

1. A method for the recovery of a clock signal from a data signal, wherein edges of the signal are each represented as a chronologically-ordered sequence of timing points, the method comprising:
    resolving the timing points of the data signal by a nominal clock pulse;
    estimating bit-period deviations for the resolved timing points by means of a parallel filter;
    injecting the nominal clock pulse to the estimated bit-period deviations,
    wherein, in one procedural stage, a plurality of timing points of the data signal are processed in parallel; and
    assigning data edges of the signal to the clock pulse and interpolation of identified missing edges.

2. The method according to claim 1, wherein the assignment of data edges to clock edges uses an internal clock signal (FRONT CLOCK), which is phase-coupled with the clock signal of the parallel linear filter.

3. The method according to claim 2, wherein a data edge $D_a$ is assigned to a clock edge $C_b$, if the following applies:

$$|D_a - C_b| \leq \Delta a, b \geq 0,$$

wherein $\Delta$ is selected in such a manner that the time axis is subdivided into mutually non-overlapping intervals.

4. The method according to claim 2, wherein a data edge $D_a$ is assigned to a clock edge $C_b$, if the following applies $$Q_{b-1} < D_a \leq Q_b a, b \geq 0,$$

wherein the timing points $Q_b$ subdivide the time axis into mutually-adjacent intervals.

5. The method according to claim 2, wherein phase deviations of the internal clock signal (FRONT CLOCK) and of the clock signal of the parallel linear filter are accumulated and adopted only after a predetermined threshold for the internal clock signal (FRONT CLOCK) has been exceeded.

6. The method according to claim 1, wherein the parallel linear filter operates according to the "clustered look-ahead" principle.

7. The method according to claim 1, wherein the parallel linear filter operates according to the "scattered look-ahead" principle.

8. A non-transitory computer-readable data medium storing instructions, which implement a method according to claim 1 when executed by a computer.

9. A device for recovery of a clock signal from a data signal, wherein edges of the signal are each represented as a chronologically-ordered sequence of timing points, said device comprising:

means for resolving the timing points by a nominal clock pulse;

means for estimating bit-period deviations for the resolved timing points by means of a parallel filter;

means injecting the nominal clock pulse to the estimated bit-period deviations, wherein, in one procedural stage, a plurality of timing points of the data signal are processed in parallel; and means for assigning data edges of the signal to the clock pulse and interpolation of identified missing edges.

* * * * *